United States Patent

Park et al.

[11] Patent Number: 5,961,741
[45] Date of Patent: Oct. 5, 1999

[54] METAL SEMICONDUCTOR OPTICAL DEVICE

[75] Inventors: Kang-Ho Park, Seoul; Jeong-Sook Ha, Daejeon, both of Rep. of Korea

[73] Assignee: Electronics and Telecommunications Research Institute, Daejeon, Rep. of Korea

[21] Appl. No.: 08/842,867

[22] Filed: Apr. 17, 1997

[30] Foreign Application Priority Data

Dec. 14, 1996 [KR] Rep. of Korea .................. 96-65731

[51] Int. Cl.$^6$ ..................... H01L 31/06; H01L 27/095
[52] U.S. Cl. ......................................... 136/255; 257/485
[58] Field of Search .................................. 136/255, 256

[56] References Cited

U.S. PATENT DOCUMENTS 5,482,570  1/1996  Saurer et al. ........................ 136/255
5,644,156  7/1997  Suzuki et al. ........................ 257/485
5,665,175  9/1997  Safir .................................... 136/256

Primary Examiner—John Goodrow
Attorney, Agent, or Firm—Cohen, Pontani, Lieberman & Pavane

[57] ABSTRACT

The present invention provides a metal semiconductor optical device which is capable of thinly uniformly growing a metal film on a semiconductor substrate using a layer functioning as an interface active agent and decreasing the density of interface energy state occurring between the metal thin film and the semiconductor, to thereby enhance the optical absorption efficiency of light beam. The interface single atomic layer is formed by one of the group V elements, e.g., one of antimony(Sb) or arsenic(As). Additionally, the metal thin film has a thickness of approximately 30 Å.

3 Claims, 1 Drawing Sheet

METAL SEMICONDUCTOR OPTICAL DEVICE

BACKGROUND OF THE INVENTION

1. Field of the Invention

The present invention relates to a metal semiconductor optical device and, more particularly, to a metal semiconductor optical device which is capable of effectively enhancing an absorption rate and hence characteristics of interface of a junction, through the use of Schottky barrier effect presenting in the junction between a metal thin film and a semiconductor substrate.

2. Description of the Prior Art

In general, in metal semiconductor optical devices, it should be formed on a metal contact surface an extremely thin film metal so as to overcome degradation of optical efficiency inducing by reflection and absorption of light beam from and to the surface, when the light beam is illuminated onto the metal contact surface. In case of a photodiode or a solar battery using Schottky barrier effect presented in junction surface in the metal oxide semiconductor, there are three types of photo current components: one is light with hv>Vs(the Schottky barrier) which is absorbed on a metal layer and exceed to the Schottky barrier and excites electrons within the semiconductor; another is that with hv>Eg of a shortwave length which is mainly entered to a depletion region and delivered to the semiconductor, and the other that with hv=Eg which is entered to a neutral region. The solar battery using such Schottky barrier effect should be manufactured an extremely thin metal so as to absorb a considerable amount of light beam.

Referring to FIG. 1, there is shown a cross-sectional view of a solar battery using the Schottky barrier which is the metal semiconductor optical device previously disclosed. As presented in FIG. 1, the solar battery has a structure that a metal thin film 2 is formed on a portion of semiconductor substrate 1, a dielectric film 3 is deposited on the other portion of the semiconductor substrate 1, i.e., at sides of the metal thin film 1, an anti-reflection film 4 is provided on the metal thin film 2 to prevent light beam impinged onto the metal thin film 2 from reflecting therefrom, electrodes 5, 5 are cantilevered from edge portion of the metal thin film 2, and a rear electrode 6 is formed on bottom surface of the semiconductor substrate 1.

The solar battery with the above identified structure has advantages that its fabricating step can be performed at lower temperature, and it may easily be adapted to a polycrystal and a thin film solar battery, and hence, it generates a higher output power (for this reason, it exist the depletion region within the semiconductor).

As stated above, in case of the photodiode or the solar battery utilizing the metal semiconductor junction, in order to increase an optical absorption factor and the transition efficiency of light energy to electric energy, the metal thin film should be extremely thinly formed, for example, in a thickness of approximately 100Å. Unfortunately, in the prior art photodiode or solar battery, since the metal film is directly deposited on the semiconductor substrate 1 to obtain the metal semiconductor junction structure, the metal thin film may not be uniformly formed on the substrate 1.

Accordingly, a thickness of the metal film to be deposited thereon sufficiently should be thick so as to evenly deposit on the substrate. Furthermore, due to the influence of an interface electric band entailed at junction the metal thin film and the semiconductor, it suffers from shortcomings that the optical absorption factor of light beam on the metal film is degraded and hence the transition efficiency of light to electric energies is decreased.

SUMMARY OF THE INVENTION

It is, therefore, a primary object of the present invention to provide a metal semiconductor optical device, which is capable of thinly uniformly growing a metal film on a semiconductor substrate and decreasing the density of interface energy state, to thereby enhance the optical absorption efficiency of light beam.

In accordance with the invention, there is provided a metal semiconductor optical device having a junction structure of a semiconductor substrate and a metal thin film, wherein an interface single atomic layer is formed between the semiconductor substrate and the metal thin film.

Preferably, the interface single atomic layer may formed by one of the Group V elements. More specifically, the interface active layer may be made of one of antimony(Sb) or arsenic(As).

Additionally, the metal thin film has a thickness of approximately 30 Å.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Next, a description will be made as to an embodiment of the present invention.

Figure 2:
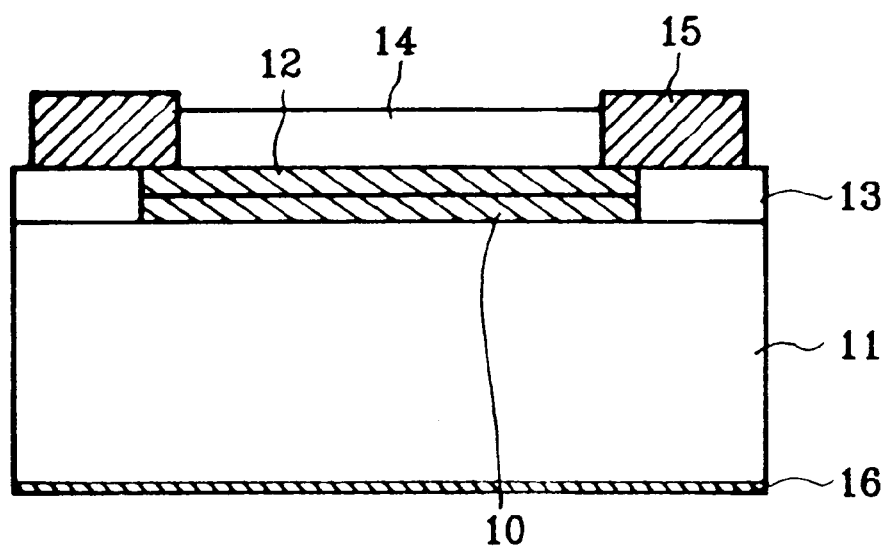
FIG. 2 showing a cross-sectional view illustrating a metal semiconductor optical device in accordance with a preferred embodiment of the present invention.

Referring to FIG. 2, there is illustrated a cross-sectional view of a metal semiconductor optical device in accordance with a preferred embodiment of the present invention.

First, a dielectric film 13 is formed on a semiconductor substrate 11. Then the dielectric film 13 is selectively removed by a mask, thereby forming an area encompassed by the remaining dielectric film 13. Thereafter, group V of elements such as antimony(Sb) or arsenic(As), which acts as an interface active agent, is deposited on the area on the semiconductor substrate 11, to thereby form a interface active layer 10.

Figure 1:
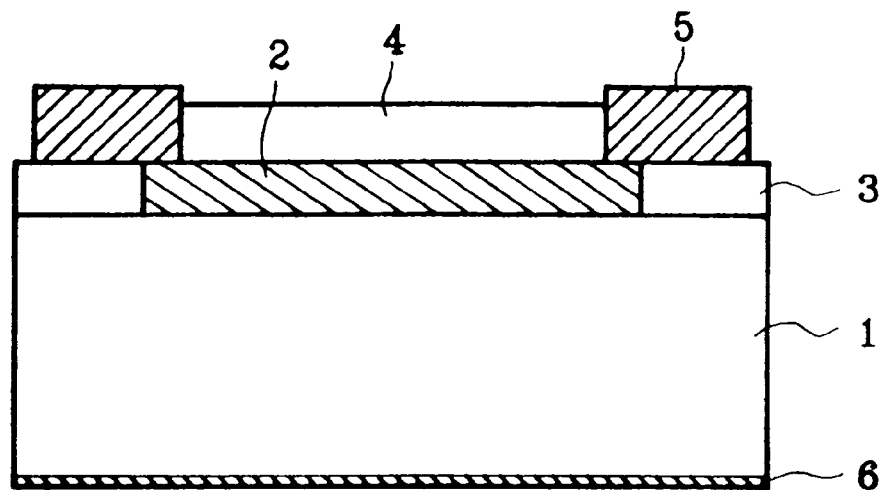
FIG. 1 depicts a cross-sectional view explaining a structure of metal semiconductor optical device previously described.

Subsequently, there are formed a metal thin film 12 on the interface single atomic layer 10. And, an anti-reflection film 14 corresponding to the film 4 shown in FIG. 1 is provided on the metal thin film 12 to prevent light beam impinged onto the metal thin film 2 from reflecting therefrom. In a next step, an electrode 15 which is electrically connected to the metal thin film 12, is formed at sides of the anti-reflection film 14, wherein the electrode 15 also corresponds to the electrode 5.

Subsequently, there are deposited a rear electrode 16 corresponding to the rear electrode 6 presented in FIG. 1 on bottom surface of the semiconductor substrate 11.

In the above, since group V of elements is uniformly deposited on the semiconductor substrate 11 as a single atomic layer, it is effectively removed a dangling bond in surface of the semiconductor, resulting in the decrement of an interface trap effect causing by the interface energy state within bandgap, to thereby easily control thereof.

In addition, the optical absorption factor may be enhanced by decreasing a needless interface energy state within bandgap. Likewise, the metal thin film 12 with a thickness of approximately 30Å may be formed on the interface single atomic layer 10 by decreasing such surface energy. For this reason, when the light beam is transmitted onto the metal thin film 12, the optical absorption and reflection factors of the light beam to and from the metal thin film 12 are decreased to thereby allow it to increase the volume of the light beam to be impinged onto the semiconductor. Thus, it is possible to improve the transfer efficiency of the optical energy to the electric energy.

In actual, since there are the interface energy state within the bandgap in case of the metal semiconductor junction, it may be occurred the loss of energy during the optical absorption and the charge transfer procedures.

In accordance with a preferred embodiment of the present invention, since one of the group V of elements is formed on the metal thin film as a single layer, the dangling bond presenting in surface of the semiconductor is eliminated to thereby reduce the interface energy state in the bandgaps.

As demonstrated above, the metal thin film is extremely thinly formed on the semiconductor substrate, a substantial amount of light beam may be impinged onto the semiconductor, thereby allowing it to further enhance the optical absorption factor. In addition, since the interface energy state causing in the bandgap between the metal thin film and the semiconductor is decreased. The present invention is possible to increase a current transfer efficiency of the semiconductor.

Therefore, it may be achieved the minimization of energy loss in the optical device and the improvement of the performance thereof.

While the present invention has been described with respect to the particular embodiments, it will be apparent to those skilled in the art that various changes and modifications may be made without departing from the spirit and scope of the invention as defined in the following claims.

What is claimed is:

1. A metal semiconductor optical device having a junction structure consisting of a semiconductor substrate and a metal thin film, including:

a layer functioning as an interface single atomic layer formed between the semiconductor substrate and the metal thin film, wherein said interface single atomic layer comprises any one of elements of group V.

2. The optical device according to claim 1, wherein said mental thin film has a thickness of approximately 30 Å.

3. The metal semiconductor optical device according to claim 1, wherein said interface single atomic layer enhances light absorption efficiency via uniform growth of said metal thin film and elimination of interface states.

* * * * *